United States Patent [19]
Helms et al.

[11] 4,257,002
[45] Mar. 17, 1981

[54] AUTOMATIC HARNESS TESTER

[75] Inventors: William E. Helms, Orange; Jack W. Adams, Alta Loma, both of Calif.

[73] Assignee: Thomas & Betts Corporation, Raritan, N.J.

[21] Appl. No.: 968,820

[22] Filed: Dec. 11, 1978

[51] Int. Cl.³ .............................................. G01R 19/00
[52] U.S. Cl. ................................. 324/66; 179/175.3 A
[58] Field of Search .................... 324/66; 179/175.3 A

[56] References Cited
U.S. PATENT DOCUMENTS

| | | | |
|---|---|---|---|
| 3,902,026 | 8/1975 | Rogers et al. | 324/66 |
| 3,914,561 | 10/1975 | Schardt | 179/175.3 A |

*Primary Examiner*—Michael J. Tokar
*Attorney, Agent, or Firm*—James J. Daley; Robert M. Rodrick; Jesse Woldman

[57] ABSTRACT

Apparatus is disclosed for storing the circuit conditions existing between a plurality of points established by the conductors of a "known" multiconductor harness and for comparing the circuit conditions existing between a plurality of points established by the conductors of a multiconductor harness to be tested with the circuit conditions of the conductors of the said known multiconductor harness. The apparatus comprises storage means for storing information representative of circuit conditions existing between the plurality of points established by the conductors of the known multiconductor harness, testing means for applying a signal to the points of the harness being examined, detection means responsive to the signal for identifying the existence of circuit conditions between the plurality of points of the harness being examined, transfer means responsive to the detection means for transferring information representative of the circuit conditions of the conductors of the known multiconductor harness to the storage means, comparing means for comparing the circuit conditions existing between the plurality of points as established by the conductors of the known harness with the circuit conditions existing between the plurality of points as established by the conductors of the harness to be tested, signaling means responsive to the comparing means for indicating the results of the operation performed by the comparing means, and control means for selectively operating the transfer means when the conductors of the known harness are connected to the aforementioned points and for selectively operating the comparing means and the signaling means when the conductors of the multiconductor harness to be tested are connected between the aforementioned points.

35 Claims, 8 Drawing Figures

AUTOMATIC HARNESS TESTER

FIELD OF THE INVENTION

This invention is directed to the field of wire identification and harness testing and, more particularly, to apparatus having the capability of storing the circuit conditions existing between a plurality of points established by the conductors of a known multiconductor harness and for comparing the circuit conditions existing between a plurality of points established by the conductors of a multiconductor harness to be tested with the circuit conditions of the conductors of the known multiconductor harness and for providing indication of the results of the comparison to the user of the apparatus.

BACKGROUND OF THE INVENTION

Electrical equipment is wired in many instances with a multiplicity of wires which have to be soldered or wrapped on a specific set of terminals. The terminals may be in a plug which has a series of predesignated connection points and which is, in turn, generally plugged into an analogous receptacle which receives the plug for making an electrical connection.

Oftentimes, wires are connected between two distant points on circuit boards or panels which have analogous designations to the points to which they have been previously wired. The ability to identify the particular designation of a wire which has to be connected at a location remote from the point to which it has been initially connected or wired is difficult. This has been particularly true when a large bundle of wires has been preconnected to a plurality of predesignated connection points and led in a bundle, harness or conduit to a distant location. When the bundle has been led to a distant location, it is virtually impossible to determine the predesignation of the wire and/or the predesignation of the point to which it is to be connected.

Such problems have led to the development of devices such as whose shown in U.S. Pat. Nos. 3,609,538 and 3,740,644 assigned to the assignee of the present invention. The '538 patent discloses a wire identification system in which a low voltage source is coupled to one end of a randomly selected conductor in a multiconductor cable, and the resulting signal developed in the selected conductor is decoded by a diode matrix coupled to the opposite ends of all of the conductors in said multiconductor cable to produce "tens" and "units" outputs which drive respective display indicators to visually designate the particular cable which has been randomly selected. The '644 patent is similar to the '538 patent, but has improvements in that the unit disclosed therein has the ability to operate in either a random mode or a select mode (wherein the display is inhibited until a particular wire is found) and also has the advantage of being able to use a portion of the user's body as a manipulative extension of a probe in such a way that the operator's finger completes a very low current conductive path from the power source through the probe and through the wire being touched.

Another type of prior art apparatus useful in identifying the wires of a multiconductor harness is similar to those described in the aforementioned '538 and '644 patents, but varies slightly in its circuit configuration by including means for sequentially energizing the outputs of a diode matrix. When the probe (such as the user's finger) is applied to an energized line, a gated signal is employed to stop a clock at the particular designation corresponding to the wire being touched, thereby creating a display of the conductor engaged by the operator's finger.

A problem analogous to the identification of wires of a multiconductor cable is the problem of testing a harness (either during or after assembly) to confirm that the conductors of the harness have been interconnected to the proper end points. One such technique prevalent in the industry for verifying the proper interconnections and integrity of an assembled harness (or for verifying the proper interconnection of the individual conductors as the harness is being assembled) is to employ a "known good" harness as a standard against which the assembled harness or harnesses may be compared to verify their accuracy. For example, the known good harness may be situated beneath a work surface upon which an assembler is preparing new harnesses. The respective end points of the good harness are electrically brought up into the area accessible by the worker. In assembling the new harness, one end of the wires thereof are electrically connected, for example through a plug, to one set of ends of the known good harness positioned beneath the work area. The harness assembler may then connect the opposite ends of the harness wires under assembly to electrical leads connected to the opposite ends of the good harness which is functioning as the standard. It will be appreciated that when the assembler correctly assembles the opposite ends of a given wire, a circuit will be completed through that wire and the corresponding wire in the known good harness which fact may then be used to energize a visual and/or audible signal indicating the proper termination, which signal is derived from the completed circuit. Of course, an incorrect termination by the assembler may be visually displayed as well.

It will be appreciated that the technique of continually comparing the harness under construction, or one which has been completed, to an actual known good harness which functions as a standard for comparison purposes is a rather complex, cumbersome technique. Among its many drawbacks is the fact that the plurality of "known good" harnesses must be initially constructed, one such known good harness must be provided in a special jig at each assembly station, and each jig must be specially constructed to facilitate the construction of a specified harness in that new known good harnesses and new jigs must be provided each time a different harness is to be assembled on the production line. Also, when a harness has been tested in the field or at a place remote from the location of the production line, either a known good harness must be shipped out to the remote location or the harness to be tested must be shipped to the location of the production line.

More recent attempts to facilitate the testing of completed harnesses have suggested the use of an apparatus having an internal memory to store information representative of the circuit connectors of a known good harness for comparison purposes with the conductors of the harness being examined. Such prior art devices have had drawbacks, however, in their inability to function in a monitor mode (i.e., useable during assembly of the harness to verify connections on a wire by wire basis); have been unable to verify multiple circuits (where a plurality of conductors are connected in common); have not employed transferable internal storage means (thereby making it difficult to interchange information between like devices); and/or have not had the capability of "learning" the known good harness by merely examining it (thereby requiring that information representative of the known good harness be physically inputed, for example by keypunching, into storage).

SUMMARY OF THE INVENTION

The present invention also relates to apparatus for testing the correctness of a multiconductor harness, either after it has been assembled in its entirety or during the assembly thereof. The instant invention does not require that the harness being tested (or assembled) be compared with an actual "known good" harness. Rather, in accordance with the instant invention, information representative of the circuit conditions of a known correct multiconductor harness is stored in a memory provided as part of the apparatus. Thereafter, the harness being tested (or being assembled) is electronically compared to the information representative of the correct circuit conditions in storage and the harness assembler is appraised of the results of such comparison.

In accordance with preferred features of the instant invention, the information representative of the known correct circuit conditions may be introduced into storage by initially scanning and "learning" the proper arrangement or, alternatively, the information representative of the proper circuit conditions of the "known good" harness may be inputed into the apparatus from standard magnetic tape storage devices, such as, for example, a conventional cassette. In this manner, cassettes containing the information representative of a great variety of desired harness arrangements may be conveniently stored in inventory and selectively disbursed to widely scattered operator stations, dependent upon the particular harnesses that are being assembled at a particular plant location. Also, the data stored in the tape cassette and/or the aforesaid memory lends itself to transmission over a wire or wireless carrier to distant points of the earth, said transmission taking far less than a minute.

The system of the present invention has a further feature in that it is capable of preparing a tape by direct readout of the data stored in memory to a tape recording device which, due to the techniques employed, enable the use of inexpensive recording equipment.

Still another feature incorporated in the present invention is the utilization of program routines, any one of which may be called out in accordance with the selected operating mode and performing the learning and/or testing steps in microsecond speeds.

The display features of the equipment are such as to provide both audible and visual indications of the presence of an error, the type of error which has been encountered, the satisfactory completion of a harness under test, and the satisfactory completion of a self-test, with the self-test and test operations being completed in less than one second.

The system is of a microprocessor based design wherein all of the subassemblies within the system are operated by the microprocessor under control of the programs stored in memory, which is preferably a read only memory. The program routines have been designed so as to have universal application. For example, the display routine is employed in conjunction with the programs utilized for the self-test, test and monitor modes, significantly reducing the amount of program memory required.

The system hardware, together with the manipulation thereof, permits monitoring and testing without any limitations whatsoever imposed upon either the wiring configuration of the harness under test or, in the case of monitoring of a harness under assembly, without any limitation on the order of performance of the assembly operations.

OBJECTS OF THE INVENTION AND A BRIEF DESCRIPTION OF THE DRAWINGS

It is, therefore, one object of the present invention to provide a novel system for examining harnesses of either simple or complex multiwire configurations and for converting the harness configuration and interconnections into data which is preferably stored in high-speed random access memory means, said conversion being performed at very high speed and without the intervention of any manual functions.

Still another object of the present invention is to provide a novel system for testing harnesses of either simple or complex multiwire configurations wherein the test is performed automatically at high speed through the examination of the harness under test and the comparison of the circuit configurations detected against data representing a known standard harness, which data is stored in a high-speed random access memory.

Still another object of the present invention is to provide a novel system for use in monitoring the assembly of either simple or complex harnesses of multiwire configurations wherein the test operations are performed automatically at high speed and totally independently of the order of performance of the assembly steps.

Still another object of the present invention is to provide a novel system for testing and/or facilitating the assembly of both simple and complex harnesses of multiwire configurations wherein means are provided for converting the data representative of a known standard harness into a form capable of being transmitted over wire or wireless transmission channels, as well a being capable of direct transfer to serial type storage devices.

Still another object of the present invention is to provide a novel system for monitoring and/or testing harnesses in which the harness under test is examined to establish the nature of the interconnections and compare it against the good harness in the form of data stored in the memory, wherein the system provides means for loading the aforesaid data into memory through demodulator and data conversion means as an alternative to the need for direction examining and testing the known standard harness.

The above, as well as other objects of the present invention, will become apparent when reading the accompanying description and drawings in which.

DETAILED DESCRIPTION OF THE INVENTION

Figure 1:
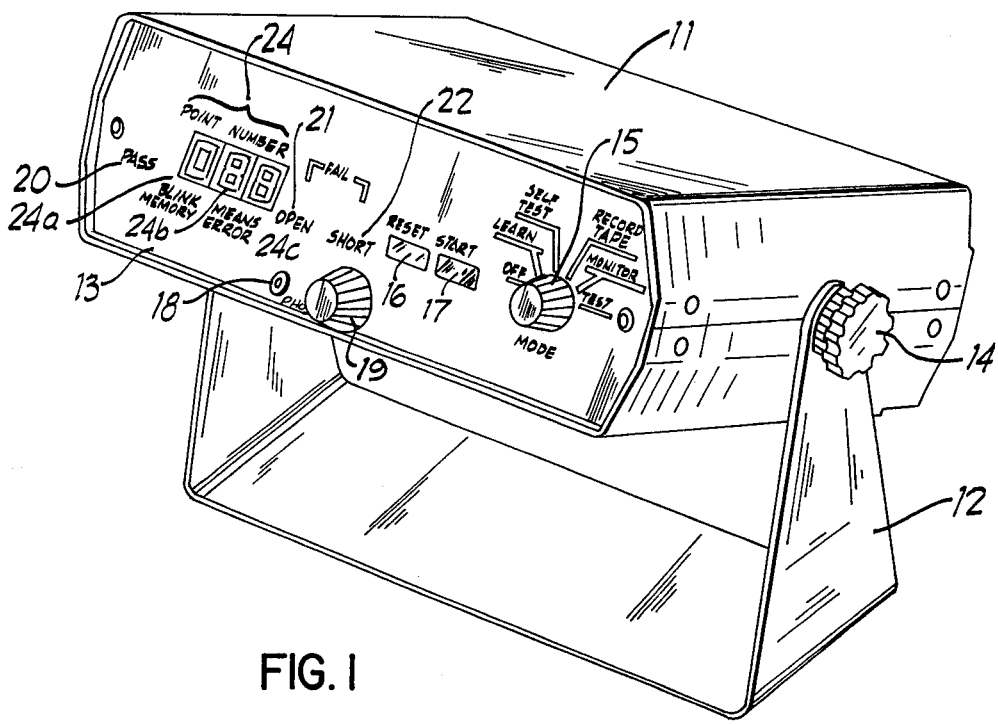
FIG. 1 shows a perspective view of the harness testing and monitoring system of the present invention.
Figure 2:
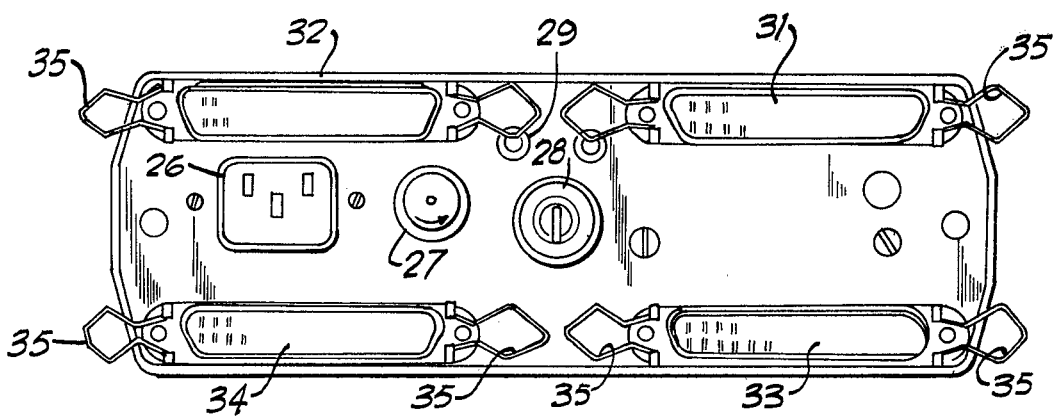
FIG. 2 shows an elevational view of the rear panel of the apparatus of FIG. 1.

The physical appearance of the apparatus 10 embodying the principles of the present invention is shown best in FIGS. 1 and 2 and is comprised of a housing 11 swingably supported upon a stand 12 to enable adjustment of the front panel 13 to suit the viewing convenience of the operator. Once housing 11 is oriented relative to stand 12, locking knobs 14, only one of which is shown, may be tightened to retain the angular orientation of the housing.

The front control panel is provided with a manually operable control knob 15 adapted to be rotatably moved between a plurality of positions identified as OFF, LEARN, SELF TEST, RECORD TAPE, MONITOR and TEST.

A reset push button 16 is provided for resetting the unit following the completion of a test. The start push button 17 serves to initiate operation of the equipment when control knob 15 is set to the LEARN mode; is used to start a tape recording operation when the control knob 15 is set to the RECORD TAPE mode; and is further used to start a new test which may either be the first test of a series or may be the test to be performed after a reset operation.

The unit is provided with an internal speaker (not shown) which is energized when an assembler attempts to make an incorrect termination during the time the control knob 15 is set to the MONITOR mode. In the event that the internal speaker may be the source of an annoyance to other people in the immediate vicinity and, especially in the case where a number of operators utilizing the same equipment are working in close proximity to one another, it is extremely advantageous to isolate the audible alarm of one unit from being misinterpreted as the audible alarm of a nearby unit. This is accomplished through the provision of a phone jack 18 adapted to receive the connecting plug of a set of earphones. When the earphone plug is inserted into phone jack 18, the internal speaker is automatically disconnected. Manually operable control knob 19 provides volume control for both the internal speaker and the earphones connected through phone jack 18.

The visual display for the system consists of light sources, which are preferably light emitting diodes (LED's) for indicating certain conditions. LED 20 is illuminated to indicate a successful test when control knob 15 is set to the TEST mode; to indicate the conclusion of learning of a known good harness and storage of the interconnections in the memory when the control knob 15 is set to the LEARN mode; and to indicate successful completion of a record sequence when control knob 15 is set to the RECORD TAPE mode.

The OPEN LED 21 serves to indicate when an erroneous OPEN condition has been detected. SHORT LED 22 is illuminated when an erroneous short or continuity condition is detected. The illumination of either LED 21 or 22 constitutes a failure condition.

A point number display 24 is comprised of three display digits 24a, 24b, and 24c, capable of displaying any point number from 000 through 999. The display is arranged to display both points under test with the numbers of these points being displayed sequentially and the lower number being displayed first. The display is activated only in the case of a fault condition.

The display digits, which may be of the segmented type, are further adapted to blink in the event that an error has occurred in the memory.

FIG. 2 shows the rear panel of the apparatus shown in FIG. 1, which panel is provided with a three prong plug 26 for coupling to a local source. The unit is adapted to operate on line voltages of either 115 or 230 volts RMS (nominal), 50 to 60 Hz. The instrument is typically provided with a label indicating the proper line voltage at which the unit is to be operated.

A rotatable knob 27 covers the socket for receiving a current protecting fuse (not shown for purposes of simplicity).

A key switch 28 is adapted to receive a key, typically carried by only authorized personnel, for purposes of selectively enabling or disabling the LEARN and RESET switches. The key may, for example, be carried by supervisory personnel to prevent resetting of a fault condition by an operator without bringing the fault to the attention of a supervisor. Also, the key may be carried by supervisory personnel to prevent an operator from initiating a LEARN mode without first advising the appropriate supervisory personnel of the operation to be performed in order to be assured that the harness or cassette from which the known good harness data is being taken is, in fact, the proper one from which the information is to be derived.

A tape-in phone jack 29 is provided for receiving the plug (not shown) of a tape recorder for purposes of playing a tape and transferring its contents to system memory.

Tape-out phone jack 30 is used for receiving the interconnecting plug of a tape recorder for the purpose of transferring data stored in system memory to a tape cassette provided within the recorder.

In the preferred embodiment described herein, four connector sockets 31-34 are provided for interconnection with connector plugs which may be releasably inserted within the connector sockets. In the embodiment described herein, and, as shown in FIG. 2, the connectors are of the 50 point type. For example, a wire harness having a connector plug compatible with the connector sockets 31-34, has one of such connector plugs inserted into connector socket 31, while the connector plug at its opposite end is inserted into connector socket 32, for example. The harness under test or being assembled need not be directly connected into the sockets 31-34, but may alternatively be connected through additional coupling cables (not shown) which have their opposite end connectors led to the surface of a work station upon which either completed harnesses are tested or new harnesses are being assembled. Although the harnesses being tested or assembled may have end connector plugs which are directly insertable into the connector sockets 31-34, it should further be understood that harnesses having any other type of end connectors may be tested with the equipment of the present invention simply by providing an interfacing connector for interfacing any form of a connector used with the harness which is not directly connectable into the sockets 31-34 with an appropriate interfacing connector which is directly connectable into the connector sockets 31-34.

In the example given, the unit shown may actually test two harnesses simultaneously. For example, a single harness having end connectors with 50 terminal connections may have one end connector plugged into connector 31 and have its opposite end connector inserted into connector 33. A second harness may be similarly tested by inserting its connectors into connectors 32 and 34 of the unit. The swingable clips 35 serve to lock the connectors inserted into connectors 31-32 to prevent the units inserted therein from being dislodged or accidentally moved during a test routine.

Figure 3:
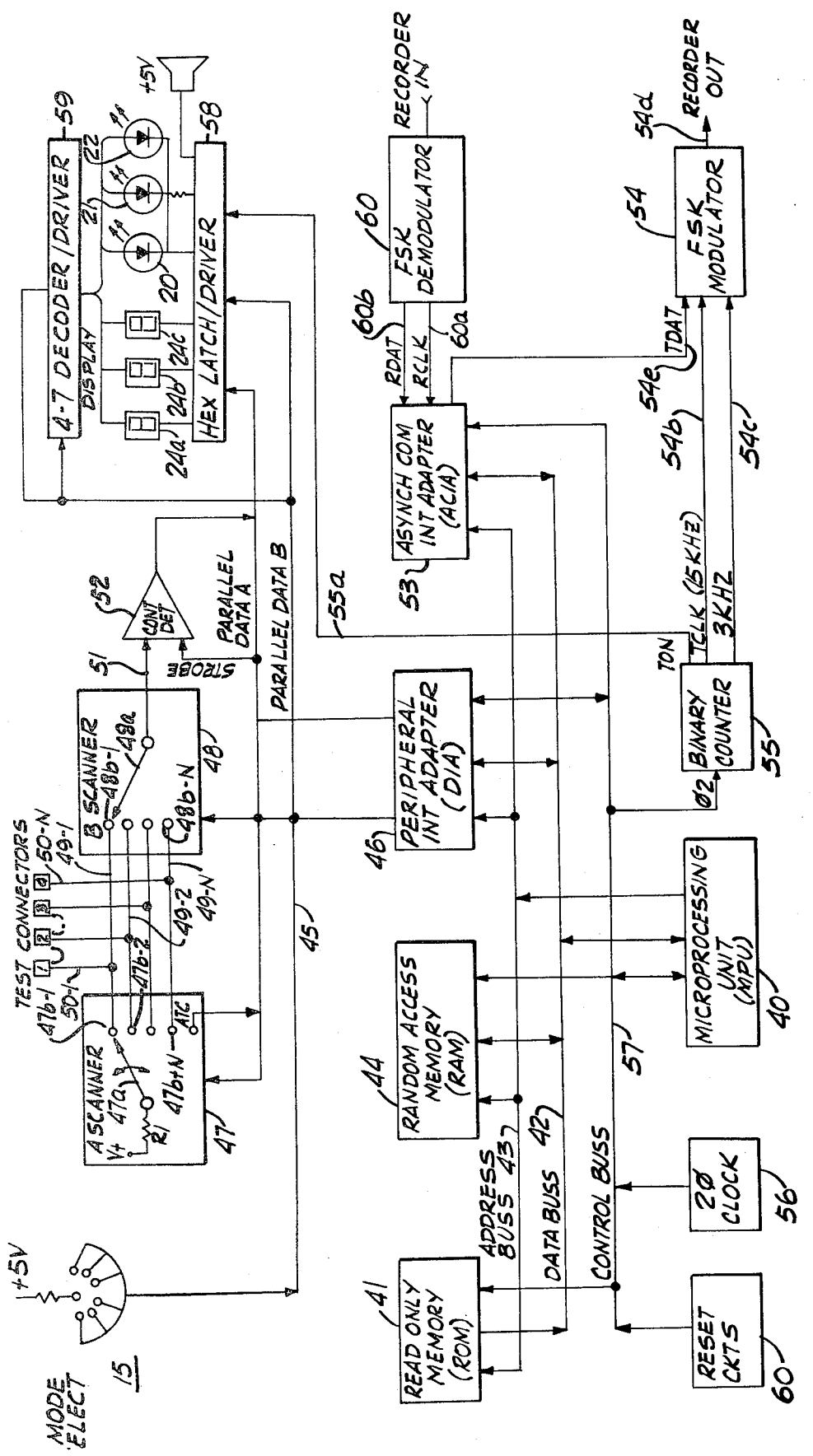
FIG. 3 is a simplified block diagram of the system of the present invention.

FIG. 3 shows a simplified block diagram of the system 10 designed in accordance with the principles of the present invention and is comprised of a microprocessing unit 40 which controls the operation and order of operation of all of the system circuitry. The microprocessor unit operates in accordance with the program routines stored in read only memory (ROM) 41. Read only memory 41 interfaces with microprocessing unit (MPU) 40 through data buss 42. Program steps are extracted (in a non-destructive readout manner) from read only memory 41 and under control of microprocessing unit 40, through the address buss 43.

The mode select switch 15 (note also FIG. 1) applies the selected mode to the microprocessing unit through the parallel data buss 45 and the peripheral interface adapter (PIA) 46.

The test signals are applied to the points of the test connectors by means of A scanner 47 which is operated under control of the microprocessing unit 40 through the peripheral interface adapter 46. As will be made obvious from the further detailed description set forth hereinbelow, scanner 47 is an electronic solid state device of the integrated circuit type. However, for purposes of simplicity, scanner 47 has been diagramatically represent as comprised of a movable scanning arm 47a electrically engageable with each of the scanner stationary contact points 47b-1 through 47b-N, the movable switch arm 47a being stepped from one stationary contact point to the next under control of the microprocessing unit, the control signals being conveyed thereto through peripheral interface adapter 46. The A scanner functions to couple a DC voltage source V+ to the contact point connected thereto and through a current limiting resistor R1. In the example given in FIG. 1, for a 200 point device, A scanner would be provided with a total of 200 stationary contact points.

The A scanner is operated in conjunction with a B scanner 48 in a manner to be more fully described. B scanner 48 is similarly comprised of solid state circuitry but, for purposes of simplicity has been diagramatically represented by rotary switch arm 48a which is incrementally stepped under control of the peripheral interface adapter 46 to selectively engage each of the stationary contact points 48b-1 through 48b-N. Like numbered points of B scanner 48 are directly electrically connected through conductive leads to the like numbered points of A scanner 47 as shown. For example, point 47b-1 is connected to point 48b-1 by conductive lead 49-1; points 47b-2 and 48b-2 are connected by conductive lead 49-2, and so forth. In the example shown in FIG. 2, it should be understood that each scanner would be provided with 200 points, and the points would be interconnected in the manner shown through the provision of 200 lines, i.e., lines 49-1 through 49-200. Each of the lines is provided with branch conductors 50-1 through 50-N respectively, which couple each of the connecting lines to a like numbered point at the rear panel of the unit as shown in FIG. 2, which points are numbered 1-50, 51-100, 101-150, and 151-200.

The B scanner switch arm 48a is coupled through lead 51 to one input of continuity detector 52 which, as will be more fully described, may preferably be a comparator amplifier which serves to develop an output signal when a voltage level is present at its input lead 51 (i.e., derived from the voltage source V+) when a strobe pulse is applied to its remaining input. This signal is coupled through the peripheral interface adapter 46 to the microprocessor unit 40 in order to initiate either a storage or a comparison operation, depending upon the operating mode to which the system is set.

In the preferred embodiment, the A scanner 47 is preferably comprised of a discrete printed circuit board which includes the integrated circuit chips sufficient for scanning 100 points. The final point of the system, identified as ATC with A scanner 47, serves to provide an indication that the entire board has been scanned in order to advise the microprocessor unit of the fact that the first board has been scaned. This information is useful in the event that the system utilizes two such boards to indicate to the microprocessing unit 40 that the first board has been scanned and that the second board should now be scanned.

As was mentioned above, the interconnections established by a known good harness may be entered into the system by means of a LEARN routine in which data is entered into the random access memory 44, in a manner to be more fully described, to identify the appropriate interconnections. In the event that it is desired to provide a facility remote from the location of the subject unit without the need for shipping an actual harness, the system provides means for transferring data from random access memory 44 (through a non-destructive readout technique) into a conventional cassette tape of the type employed in inexpensive tape recorders. Thus, the data may be recorded into the tape cassette, the tape cassette may be shipped to the remote facility, and its contents then read into a unit at the remote facility similar to that shown in FIG. 3 for the purpose of testing similar harnesses at said remote location. An another alternative, the data transferred to the tape cassette may be transmitted through a wire or wireless carrier having a frequency range capable of handling signals of the order of 3 KHz. In order to accomplish this result, microprocessor unit 40 sequentially reads the data in random access memory 44 on a word by word basis, into the asynchronous communications interface adapter 53 which serves to convert the binary word, whose bits are presented to the asynchronous communications interface adapter 53 in parallel form, to serial form, each binary bit being sequentially applied to one input of a frequency shift keyed (FSK) modulator 54. The FSK modulator transmits either one of two frequencies applied to its input 54b and 54c from a binary counter 55, the selection of the frequency to be transferred to the recorder at output 54d being determined by the binary level applied at input 54a, as was previously mentioned.

The system timing is derived from a two phase clock 56 applied to all of the circuits connected to control bus 57. One phase of the two phase clock is coupled to binary counter 55 which serves to divide down the frequency rate and provide a 1.5 kHz signal on line 54b and a 3 kHz on line 54c, as well as a higher frequency signal which is applied to the latch driver circuitry 58 forming part of the display and display control circuitry. The three segmented display elements 24a, 24b and 24c are coupled between decoder driver circuit 59 and latch/driver circuit 58. Decoder driver circuitry 59 controls the segments within each display unit 24a, 24b and 24c to be illuminated, as well as controlling which of the LED's 20, 21 and 22 are to be illuminated. The latch driver circuitry, in accordance with the frequency signal derived from binary counter 55 through line 55a serves to operate the display units in a multiplexed fashion so that even though the units are operated in an intermittent manner, the rate of flashing of the units is so rapid as to appear to the human eye to be a steady on condition.

The reset circuits 62 couple the operating switches at the front and rear panels to the circuits coupled to control buss 57 to perform resetting operations to be more fully described.

Figure 5:
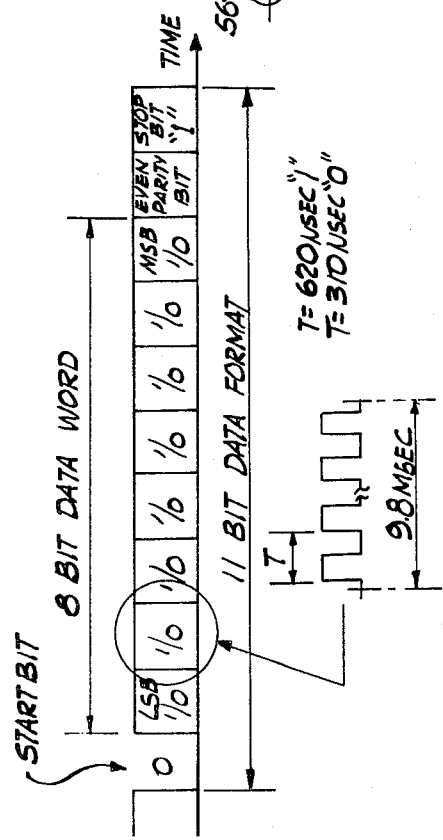
FIG. 5 shows a wave form diagram of the serial data format utilized when transferring data between memory and serial storage means.

In the record tape mode, the unit has the capability of receiving data representing the electrical interconnections of a known standard harness, which information has previously been stored in a tape cassette, for example in the manner described hereinabove. The data, which has been stored in the form of two discrete frequency states, is derived from the recorder and applied to a frequency shift keyed (FSK) demodulator 60. The demodulator 60 functions to convert each of the frequencies into respective binary levels and to drive a clock from the higher of the two frequencies for synchronization purposes. The synchronization clock is outputed onto the R CLK line 60a to be applied to the asynchronous communications interface adapter 53, while the data is placed upon the R DAT line 60b. The data is applied to the asynchronous communications interface adapter in serial fashion and is converted to parallel form. The format of the data is shown in FIG. 5 and is transmitted from memory to a tape, as well as being received from a tape to be transmitted to memory in the 11 bit data format shown in FIG. 5. The first bit of the 11 bit word is the start bit which is always binary "0". This bit is followed by an 8 bit data word with the least significant bit (LSB) immediately following the start bit, and with the most significant bit (MSB) being the last of the data word bits to be transmitted. The most significant bit is followed by an even parity bit provided for testing and thereby assuring the accuracy of the data, and the last bit of the 11 bit data format is a stop bit which is always in the binary "1" state. In the preferred embodiment being described herein, the binary "0" bit is a 3 kHz signal, while the binary "1" bit is a 1.5 kHz signal. The wave form diagram for the encircled bit shows the structure of the wave form such that the time interval for a one bit is 620 microseconds, while the time interval for a binary "0" bit is 310 microseconds, the wave form taking the wave shape as shown.

The incoming frequency shift keyed data is thus converted into binary form and is fed in serial fashion to the ACIA 53 which loads the serial data bits into a register, develops a parity bit independently of the parity bit carried by the 11 bit data word, and compares the internally generated parity bit with the received parity bit to assure the accuracy of the received data word. Presuming the word to be correctly received, it is then transferred in parallel fashion to the appropriate location in RAM 44.

FIGS. 4a-4g show some of the circuitry of FIG. 3 in greater detail. Considering FIG. 4a, the MPU 40, which may, for example, be a Motorola IC of the Model MC6800 type, and is typically comprised of a register array, address logic; an instruction register and control means; address, data and control buses; and an arithmetic and logic unit. The asynchronous communications interface adapter 53 may preferably be a Motorola integrated circuit of the type MC6850 and, as was previously described, is comprised of a serial to parallel converter and a parallel to serial converter for respectively transferring data to memory 44 and for transferring data out of memory 44 to an external tape cassette.

Figure 4A:
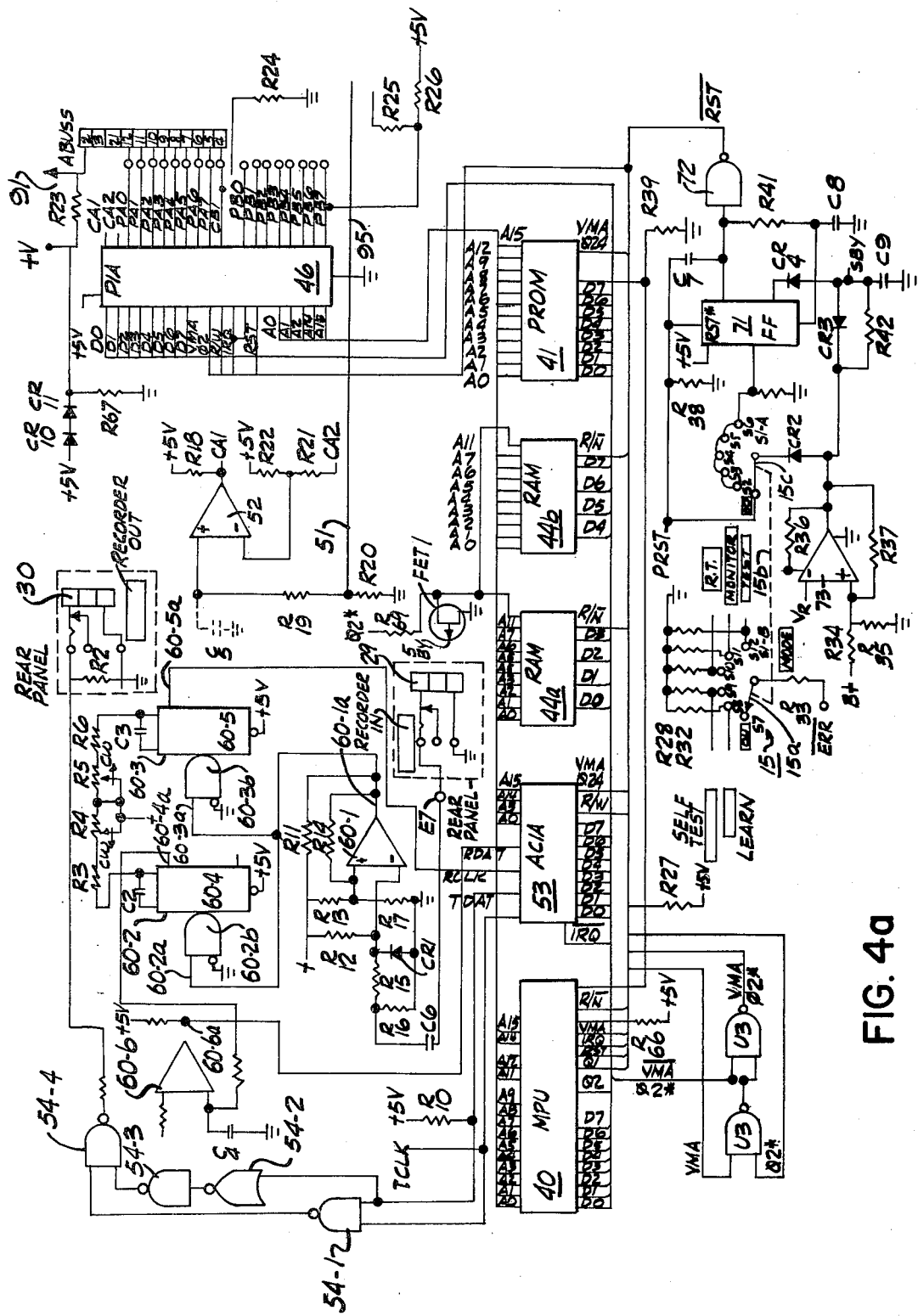
FIGS. 4a–4d show detailed schematic views of the system of FIG. 3.

The random access memory 44 is, as shown in FIG. 4a, comprised of first and second integrated circuits 44a and 44b which may be of the type 5101L, each capable of storing 1024 four bit words, thus having a total capability of storing 1024 eight bit words.

The read only memory 41 which may, for example, be a programmable read only memory (PROM) may, for example, be an integrated circuit of the type 82S181 and has a storage capacity of 1024 eight bit words. The peripheral interface adapter 46 is preferably an integrated circuit of the type MC6820 which is adapted to work in a reversible fashion in the sense that it is capable of transferring data from memory to the scanners, for example, and conversely for transferring data in the reverse direction from the scanners back to memory.

The continuity detector 52 may be an integrated circuit of the type LM2901 and has its non-inverting input coupled to the Buss 51 and its inverting input coupled to a reference level established by the resistors R22 and R21 connected in series between a positive DC source as shown and pin CA2 of the peripheral interface adapter 46 to perform a continuity test only when a level appears at the CA2 terminal to indicate that switching has been completed, i.e., to indicate that switch arm 48a (see FIG. 3) has switched to a cooperating stationary contact and is not merely moving off of a contact or just starting to move onto a contact or, for that matter, is not located between a contact. The function of the signal CA2 is thus to permit the performance of a detection test only upon the completion of switching operations by both the A scanner and the B scanner (see FIG. 3).

The output of continuity detector 52 is coupled to pin CA1 of the peripheral interface adapter 46 in order to advise the MPU 40 of a continuity condition, for example, to cause storage of the continuity condition in memory during a learn mode or, for example, to compare the end points of the continuity condition against that which is stored in memory for the same points.

When it is desired to record data of a known good harness in random access memory 44, the recorder in jack receives a plug (not shown) from the recorder unit and applies a FSK signal to the non-inverting input of comparator amplifier 60-1 forming part of the FSK demodulator. The amplified signals are simultaneously applied to the inputs 60-2a and 60-3a of gates 60-2b, 60-3b, respectively, of one shot multivibrators 60-4, 60-5, also forming part of the FSK demodulator. The one shot multivibrators are adjusted by manipulation of the movable arms of adjustable resistors R4 and R5 in order to provide the proper pulse interval. For example, one shot multivibrator (OSM) 60-4 is preferably set to generate a pulse having a duration of 230 microseconds, while OSM 60-5 is set to provide a pulse having an interval of 460 microseconds. The output 60-4a of OSM 60-4 is coupled to the inverting input of comparator amplifier 60-6, also forming part of the FSK demodulator 60. The output of comparator 60-6 is coupled to the receive data input R DAT of the asynchronous communications interface adapter 53. The output 60-5a of OSM 60-5 is coupled to the receive clock input R CLK of the asynchronous communications interface adapter 53.

The FSK demodulator functions in the following manner:

As was previously described, data words are transmitted in accordance with the serial data format shown in FIG. 5, wherein a 3 kHz signal identifies a binary "0" state, while a 1.5 kHz signal represents a binary "1" state. The incoming frequency signal is applied to the operational amplifier 60-1 which functions as a SCHMITT trigger which squares up the frequency input at its output 60-1a to enhance the demodulation operation. OSM 60-5 triggers on alternate cycles of the 3 kHz signal as well as triggering on each cycle of the 1.5 kHz signal to develop the receive clock signal R CLK which is applied to the asynchronous communications interface adapter 53.

The 230 microsecond one-shot 60-4 triggers on alternate cycles of the 1.5 kHz signal and applies its output to the inverting input of the operational amplifier 60-6. The output of the one-shot 60-4 also charges capacitor C4. If the capacitor charges above the reference level $V_R$, the output developed at 60-6a is low. If the level to which capacitor C4 charges is below the reference level, the output at 60-6a is high. This binary level is applied to the receive data R DAT input of the asynchronous communications interface adapter. When the data is in sync with the clock signal R CLK, it is entered into the ACIA 53.

The ACIA 53 converts serial data to a parallel format, checks for parity, checks for the total number of bits and then places the data on the data bus 42 (see FIG. 3). The data is steered by the MPU 40 into the location in random access memory 44 called for by the address set up by the MPU 40.

When reading data out of random access memory 44 and into a tape cassette, the transmit data output T DAT of the ACIA 53 is simultaneously coupled to one input of each of gates 54-1 and 54-2, which gates form part of the FSK modulator 54 shown in FIG. 3. The remaining input of gate 54-1 is derived from pin 4 of the ACIA 53 which constitutes the transmit clock signal T CLK which in this case is 1.5 kHz.

The 3 kHz signal is applied to the remaining input of gate 54-2. The output of gate 54-2 is applied to gate 54-3 which operates as an inverter to apply its inverted output to gate 54-5. The output of gate 54-1 is coupled to the remaining input of gate 54-4. The output of gate 54-4 is coupled through resistor R1 to the phone output jack 30 which serves to connect the output of gate 54-4 to the input of a tape recorder of the tape cassette type. In operation, when the transmit data line T DAT is high, gate 54-1 is enabled to pass the 3 kHz signal to the input of gate 54-4. With the line T DAT high, gate 54-2 is disabled to develop a constant high at the remaining input of gate 54-4 to pass 3 kHz signals to the recorder. When line T DAT is low, gate 54-1 is disabled, while gate 54-2 is enabled to pass the 3 kHz signal through inverter 54-3 to the associated input of gate 54-4 to thereby pass 1.5 kHz signals to the recorder.

The mode selection switch 15 (see FIG. 1) is shown in greater detail in FIG. 4a and is comprised of a switch arm 15a which is ganged as represented by dotted line 15b, to a switch arm 15c. The switch arm 15a is designed to be electrically connected to any one of the stationary contacts numbered S7–S12, while switch arm 15c is adapted to electrically engage any one of the stationary contacts S1–S6. It can be seen that all of the contacts S1–S6 are connected in common, and this common connection is coupled to the input of flip-flop 71. Each of the stationary contacts S7–S12 which are connectable with switch arm 15a are coupled to respective inputs of the peripheral interface adapter 46. Whenever the mode switch control knob 15 is moved from any one of its positions to any other one of its positions, it can be seen that switch arm 15c is caused to make and then break a contact path between switch positions S2–S6. This causes flip-flop 71 to be set, thereby developing a reset signal at the output of inverter 72, which signal is automatically interpreted by the MPU 40 to call for a reset and thereby to begin the next operation at the beginning of the program called for by the mode switch, thus avoiding the need for a separate reset when switching from one mode to any other mode.

Figure 4C:
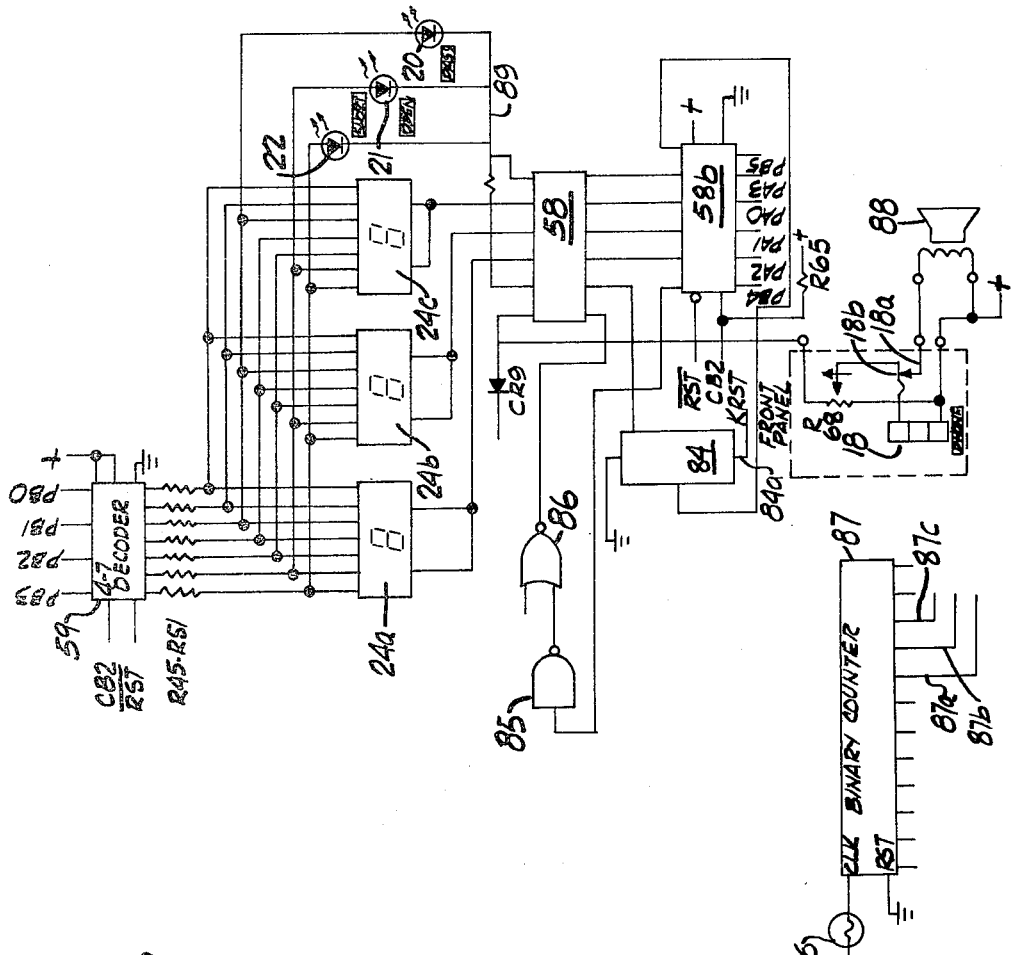
Figure 4B:
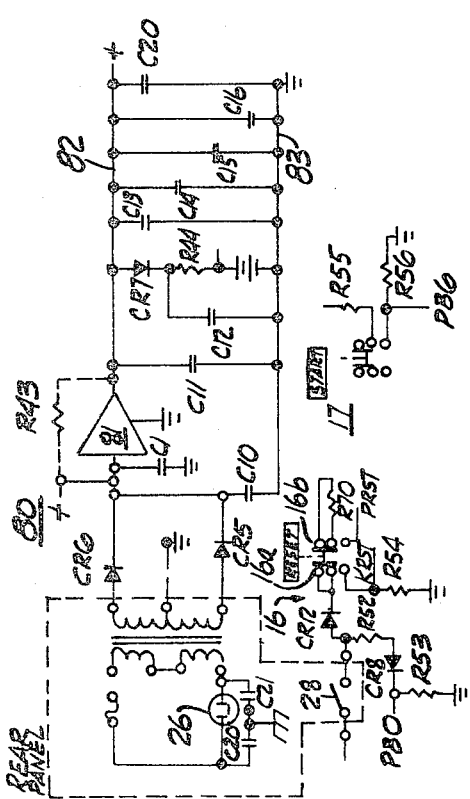

Comparator 73 monitors the B+ level developed by the power supply 80 shown in FIG. 4b. The power supply is comprised of a socket 26 (see FIG. 2) for coupling power into the unit. Capacitors C20 and C21 serve to capture transients that are known to have a deleterious affect on the RAM 44. Fuse F1 (see fuse holder 27 of FIG. 2) protects the system against overcurrent. Transformer T1 steps down the voltage and applies the step down level through the secondary winding to a full wave bridge comprised of diodes CR6 and CR5. Device 81 is a three terminal regulator which may be a Motorola integrated circuit of the model type MC7805CT which serves to provide a regulated voltage at its output. A series circuit connected across 5 volt buss 82 and ground buss 83 is comprised of diode CR7, resistor R44 and chargeable battery source BT1 which is preferably a nickel cadmium battery having a rating of the order of 1.5 to 3 volts. The common terminal between resistor R44 and battery BT1, identified as terminal $V_R$, is coupled to the inverting input of comparator 73 shown in FIG. 4a. As was mentioned hereinabove, this level is also provided to the non-inverting input of operational amplifier 60-6 (see FIG. 4a) through resistor cap R7. The common terminal between diode CR7 and resistor R44, designated $V_M$ is coupled to pin $V_M$ of both RAM's 44a and 44b. In the event of a momentary drop in power or in the event of total loss of power for a period of up to 30 days, comparator 73 develops the standby signal (SBY) at the common terminal between diode CR3 and capacitor C9, which signal is applied to the gate of field effect transistor FET1 (FIG. 4a) to allow the next phase to signal disable both random access memory chips. This signal SBY is also applied to MPU 40 to cause the write enable pin 20 of both RAM's 44a and 44b to be turned on for the duration of the either short or long term power failure. When the system is operating normally, battery BT1 is charged.

The key switch 28 also forms part of FIG. 4b and is adapted to be operated by insertion of the appropriate key in order to selectively couple the 5 volt regulated supply to one contact of the reset switch 16. The reset switch 16 is movable in the vertical direction so as to connect its lefthand conductive member 16a between terminals 3, 2 and 1 and its righthand conductive member 16b between stationary terminals 4, 5 and 6. When the reset switch 16 is not wired with a jumper wire W1, and in the event that the key switch 28 is open, when conductive member 16a is moved to bridge between contacts 2 and 1, no DC voltage is applied thereto so as to prevent the generation of a key reset signal KRST. If a KRST signal is properly generated, it is applied to the reset input 84a of a flip-flop 84, thus preventing resetting of the error flip-flop 84 in the event that it has been set to indicate the presence of an error. It is possible to override the function of the key switch by connecting jumper W1, shown by a curved dotted line, between the +5 volt supply coupled to terminal 4 so as to connect this voltage to terminal 3 and thereby couple the regulated DC power supply to terminals 3 and 2, regardless of whether the key switch 28 is open or closed.

The righthand conductive member 16b of reset push button 16 is adapted to couple the regulated DC power supply to pin 6 to develop the program reset signal PRST which serves to reset the program but which is ineffective for purposes of resetting the error flip-flop.

The start push button 17, when depressed, couples the regulated DC power supply to pin PB6 of the peripheral interface adapter 46 to couple this signal to the MPU 40 and thereby initiate operation of the starting program.

FIG. 4c shows the display and control circuitry therefor which is comprised of three digit segmented display elements 24a-24c and the LED's 20, 21 and 22 also shown in FIG. 1. Selection of the seven segments which are capable of being illuminated to form any decimal number from 0 through 9, which segments may be illuminated, either individually or in any appropriate combination, are derived from decoder 59 which, under the control of a four bit binary input coupled to terminals PB0-PB3, causes none, one, or more than one of its outputs a-g to go high for purposes of enabling all three segmented display elements 24a-24c. The display elements are operated in a multiplexed fashion by means of HEX driver 58 containing driver circuits which are energized by HEX latch 58b. HEX latch 58b receives digital control signals at its inputs PA0-PA3 and PB4 and PB5 from like numbered terminals of the peripheral interface adapter 46. The states that these inputs are latched upon receipt of a latching signal at input CB2 provide the desired operation. The lines which are driven high are latched in to cause driver circuits of 58 to illuminate each of the elements 24a-24c and the LED's 20-22 in a multiplexed manner. The sweep rate is sufficiently rapid to cause the displays to appear to the human eye to be continuously on.

In the event that an error has occurred, line PB4 of HEX latch 58b goes high, which condition is applied to gate 85. The output of gate 85 is applied to one input of gate 86 which receives pulses at the rate of 0.75 kHz from the T ON output of divide by 16 counter 87. This undulating frequency is passed through HEX driver 58 to internal speaker 88.

The input to divide by 16 counter 87 is the two phase oscillator source 56 having an output frequency of 1.568 mHz. The output lines 87a-87c provide the 3, 1.5 and 0.75 kHz output signals.

The earphone plug may be plugged into the jack 18 (note also FIG. 1) to electrically couple the earphones to the incoming signal and decouple the internal speaker 88 from the incoming 0.75 kHz signal by moving the switch arm 18a of the phone jack 18 away from the cooperating member 18b.

In the event of an error, line PB5 goes high, causing the latch to output a trigger signal to flip-flop 84 which latches upon an error. Output 84b is coupled through HEX driver 58 to a common bus 89 coupled to the LED's 20-22. The appropriate LED to be illuminated is selected by decoder 59.

Figure 4D:
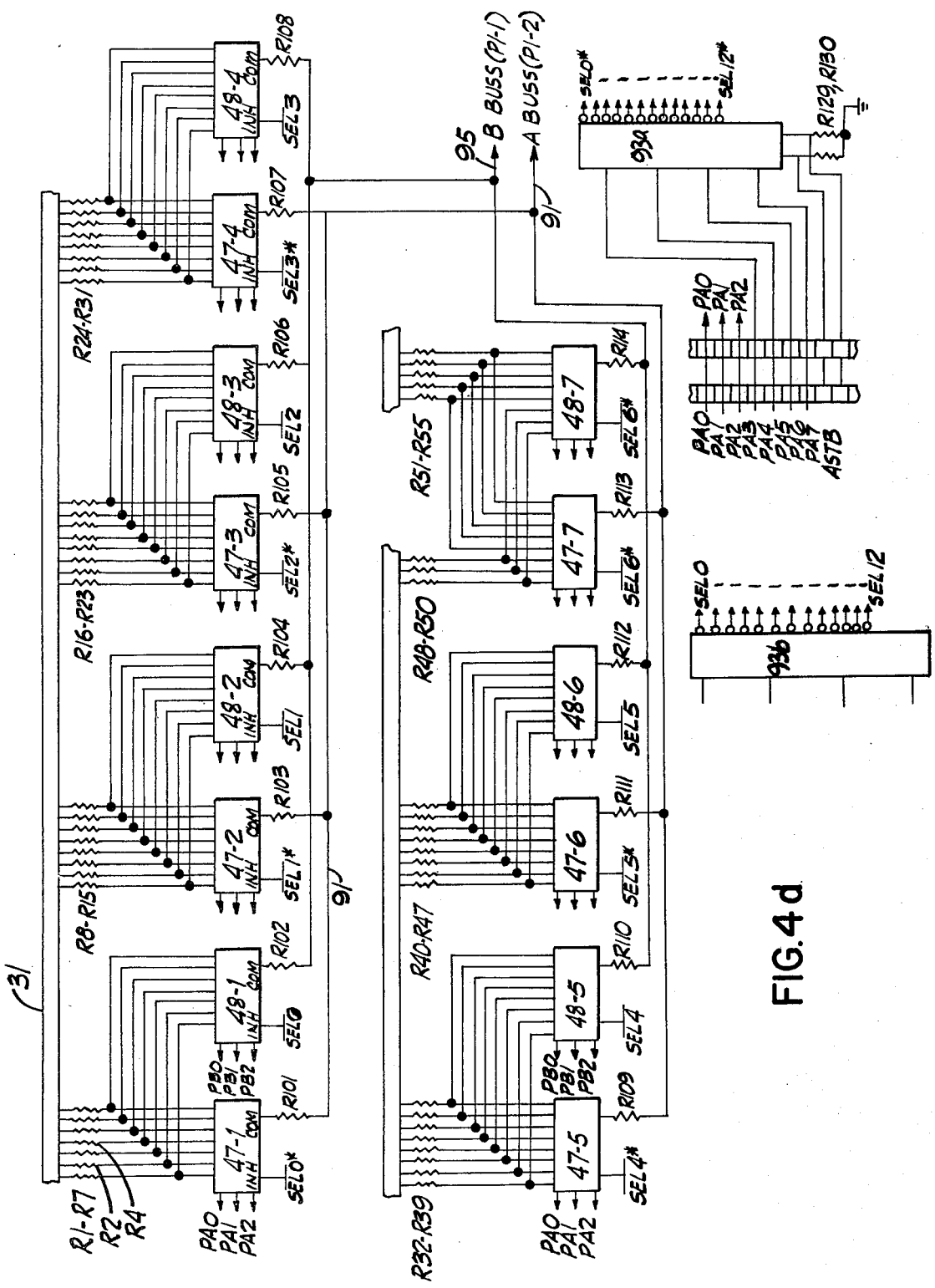

As was described hereinabove, and making reference to FIG. 3, the A scanner 47 and B scanner 48 are represented by rotary stepping switches. In actuality, the scanners are comprised of individual scanner chips as shown in FIG. 4d. For example, A scanner 47 is comprised of scanner integrated circuits 47-1 through 47-7, while the B scanner 48 is comprised of integrated circuits 48-1 through 48-7. Since all of the scanner integrated circuits are substantially identical in both design and function, only one will be described in detail.

Scanner integrated circuit 47-1 is preferably an integrated circuit of Model No. CD4051BE and is provided with an input terminal COM, eight output terminals 0-7, an inhibit input terminal INH, and three output selection control inputs A, B and C. The common terminal is coupled through resistor R101 to A buss 91 which, as shown in FIG. 4a is coupled to +5 volts through resistor R23 and diodes CR10 and CR11, which diodes serve to drop the voltage level applied to the A buss. Typically, the voltage drop across each diode is 0.75 volts for a total voltage drop of 1.5 volts.

The peripheral interface adapter 46 shown in FIGS. 3 and 4a couples scanner selection signals from its output terminals PA0-PA2 simultaneously to all of the output line selection control inputs A, B and C of the scanner circuits. In addition, the outputs PA3-PA6 are coupled to respective inputs A, B, C and D of decoder 93a. Decoder 93a may preferably be an integrated circuit Model No. MM74C154N which is adapted to cause one of its outputs SEL0*-SEL12* to develop an enabling signal. Following the example given, when the appropriate four bit binary code is applied to inputs A-D of decoder 93, its output SEL0* will be developed and applied to scanner integrated circuit 47-1, to the exclusion of all other scanner circuits. The output line selection control signals A-C in the form of a three bit binary code select which of the eight output lines will be connected in common with the input line. Let it be assumed that the three bit binary code represents the decimal number 4. In this case, the A buss will be connected through resistor R101 and common terminal COM to output line 4 and resistor 4 to terminal 4 of the connector socket 31, shown also in FIG. 2.

As is the case with the configuration of A scanner 47 and B scanner 48 in FIG. 3, it should be noted that each B scanner integrated circuit has each of its output lines coupled in common to a like numbered output line of an associated A scanner integrated circuit. Considering B scanner integrated circuit 48-1, it can be seen that its lines 1-7 are coupled in common to the lines 1-7, respectively, of the A scanner integrated circuit 47-1. This pattern is exactly repeated with regard to all of the remaining integrated circuits shown in FIG. 4d. The B scanners 48-1 through 48-7 are selectively controlled by decoder 93b whose outputs SEL0-SEL12 are selectively applied to scanners 48-1 through 48-7 in the same manner as decoder 93a selectively controls A scanners 47-1 through 47-7. The integrated circuits shown in FIG. 4d are capable of scanning slightly more than 50 of the end points of a harness. Thus, for a 200 point scanner having the connector configuration of FIG. 2, for example, it should be obvious that boards similar to those shown in FIG. 4d may be utilized to increase the number of scanning points to the desired amount.

A description of the operating modes of the apparatus will now be set forth:

Before either learning from a known good harness or comparing a harness under test against a known standard, or, for that matter, monitoring the assembly of a new harness, it is desirable to conduct a self test in order to be assured that the system is performing normally and has no malfunctions. This is accomplished by entering into a SELF TEST mode. Control knob 15 is set to the SELF TEST mode to apply a voltage appearing at the ERR terminal through resistor R33 to stationary contact S9 as shown in FIG. 4a. The signal ERR will be high so long as no error condition is present enabling a switching operation to be successfully performed. A high level signal is thus applied to the PB2 terminal of the peripheral interface adapter 46 which causes the MPU 40 to select the program routine for the self test operation from the read only memory 41. The program causes the switch arm 48a of the B scanner to electrically engage the first contact 48b-1. Switch arm 47a of A scanner 47 is set to electrically engage contact 47b-2. The switch arm 15c, as was previously mentioned, switches from the off stationary contact S1 to stationary contact S3 to set flip-flop 71 causing the development of a reset pulse which serves to clear out any of the circuits which might previously have been set during a prior operating mode.

The MPU 40 steps the program to the first program step and upon initiation of the program routine, first searches for the selected mode. Upon determining that the mode selected is the self test mode, a jump to the self test program routine is undertaken by the MPU 40, and the first step of the self test program routine in read only memory 41 is selected. As was previously mentioned, the integrated circuit scanner 48-1 is selected by decoder 93b and the output line selection control terminals A-C receive a three bit binary code from the PB0-PB2 outputs of the peripheral interface adapter 46 which cause selection of the output line 1, thus connecting output line 1 of connector 31 through resistor R1, integrated circuit scanner 48-1, common line COM and resistor R102 to the B buss 95 (FIG. 4d) which is coupled through the B buss 95 shown in FIG. 4a to the non-inverting input of continuity detector 52.

As was previously mentioned, the A scanner 47-1 is selected by decoder 93a, and output line 2 is selected by the three bit binary word derived from outputs PA0-PA2 of the peripheral interface adapter 46 of FIG. 4a, thus coupling the A buss 91 (which is approximately 3.5 volts) through resistor R101, common input COM of scanner integrated circuit 47-1 and output line 2 through resistor R2 to connector point 2 of connector socket 31.

It should be understood that at this time, no wire harness is connected during the self test operation. Hence, all dissimilar numbered contact points as between scanner integrated circuits 47 and 48 should indicate an open circuit condition. It is, however, possible that a short circuit condition could occur due to either an internal malfunction in the system electronics, or due to a damaged connector, or due to contaminating material such as dust or dirt having a conductive property and becoming lodged within any of the connector sockets 31-34 to establish a short circuit or continuity condition. Presuming that the system is in good order, an open circuit condition will exist between test connection points 1 and 2.

The B scanner 48-1 is maintained in the position just described, while the A scanner 47-1 is scanned through all of its positions 2-7 at a microsecond operating rate. The scan continues automatically to the next integrated circuit scanner 47-2 which is stepped through its outputs 0-7. A similar sequential stepping operation continues for the remaining A scanner integrated circuits 47-3 through 47-8 and so forth until the last or fiftieth point on the scan is completed, at which time the A scanner then scans the first point. Since output line 1 of A scanner 47-1 and output line 1 of B scanner 48-1 are connected in common, continuity detector 52 has a positive level signal applied to its non-inverting input as shown in FIG. 4a. As soon as this switching step has been completed, the output CA2 of the peripheral interface adapter 46 goes low under control of the next program step carried out by the MPU 40 to cause the non-inverting input of the continuity detector 52 to fall to a value of less than one volt, whereupon the continuity detector develops a negative going output signal CA1 applied to input CA1 of the peripheral interface adapter 46 which is interpreted by the MPU 40 as a continuity condition. The MPU then causes the binary coded representation for A scanner point 1 to be stored in the random access memory at the address location associated with the first connection point 48b-1 of the B scanner. In this case, the address and the contents of the address are identical, which, in accordance with the technique of the present invention, is the format for representing an open circuit condition, since an open circuit condition means that none of the test connector points 1 through N (FIG. 3) which are coupled to branch conductors 50-1 through 50-N, are connected to one another.

The self test routine is continued by advancing B scanner switch arm 48a to stationary contact 48b-2, advancing A scanner switch arm 47a to stationary contact 47b-3. The switch arm 47a is scanned through stationary contacts 47b-3 through 47b-N after which it is then sequentially caused to scan points 47b-1 and 47b-2, at which time a continuity condition is again detected by continuity detector 52, causing the location in random access memory 44 assigned to B scanner stationary contact 48b-2 to store the address of the point connected thereto, i.e., the address of A scanner stationary contact 47b-2. Thus, the address and the data stored therein are identical, again indicating an open circuit condition. The scan continues in the same manner as set forth hereinabove until B scanner 48 has been stepped to each of its stationary contact positions 48b-1 through 48b-N, with A scanner scanning through all of its points each time that B scanner occupies a position engaging one of its cooperating stationary contacts.

The positive transition of each CA1 signal developed by the continuity detector initializes a program routine to determine if the addresses of the A and B scanners are equal. If they are equal, the test is allowed to continue. If the addresses are not equal at a time that a continuity detection occurs, the short display routine is entered. The short display routine is a subroutine provided within the read only memory 41 which selectively operates the HEX latch and driver circuits 58b and 58a and the decoder circuit 59, as well as the error flip-flop 84 to provide an output indicating the presence of an erroneous short circuit condition.

In the case where a single printed circuit board containing scanner integrated circuits sufficient to scan 50 points is employed, the last point in the group is the ATC output. When this point is scanned twice without the detection of a continuity, an open circuit condition is recognized. When a self test is successfully completed with no erroneous short circuit conditions occurring, the MPU 40 selects a pass display subroutine from the read only memory 41 which operates the decoder driver circuitry 58 and the HEX latch driver circuitry 58b to illuminate the PASS light.

A LEARN mode begins by setting the mode selection switch 15 to the LEARN switch position. The internal logic on the B side of the peripheral interface adapter 46 is enabled to recognize closure of the start switch. When the switch is closed, scanning begins by applying the first address to the B scanner 48 while applying the address of the B scanner plus 1 to the A scanner. A strobe pulse is then applied to one input of the continuity detector 52 to test for continuity. If a continuity condition is present, the connection, established by the address of the A scanner, is stored in random access memory at the address location 1. If no continuity is detected, the A scanner is advanced by 1 and the next continuity test is performed by applying a strobe pulse to continuity detector 52. This routine, which consists of increment A scanner and test, increment A scanner and test, and so forth, is continued until a continuity is detected, at which time the A address will be transferred to random access memory at the memory location identified by the address of the B scanner. The B scanner is advanced, and the routine is repeated until all points of the B scanner have been scanned. When continuity has been detected and memorized for each and every B address, the pass display routine in the read only memory 41 is entered to operate the display in a predetermined way to indicate that learning is complete by illumination of the pass LED 20. The continuity and open circuit conditions for the known good harness are now stored in random access memory, and the system may be utilized for performing a monitoring function, a testing function, or a data transfer function, depending only upon the selection made by the operator.

A LEARN mode, when performed upon an actual multiwire harness or upon a simulated patch board harness, is completed within the order of $\frac{3}{4}$ second or less for harnesses of up to 200 contact points. If desired, however, data representative of a known good harness for purposes of testing similar harnesses or for purposes of assembling similar harnesses may be entered into memory from a cassette. The cassette may be prepared by transferring data out of random access memory to the tape cassette in the manner described previously. In summary, however, the mode switch 15 is set to the record tape position, the switch arm 15a vectors the program to the first program step which causes the MPU 40 to look for the mode selected. The mode selected will be presented in the form of a high level signal at the PB3 side of the peripheral interface adapter 46, which signal is interpreted by the MPU to call for a record tape mode. The MPU 40 jumps to the first program step of the record tape subroutine stored in read only memory 41 which serves to successively read out each address from random access memory 44 containing the data representative of the interconnections of the known good harness. Each data word is read out in parallel from random access memory 44 to the asynchronous communications interface adapter 53 which receives the data word in parallel, generates a binary "0" level start bit followed by the eight data word bits (least significant bit first), generates an even parity bit which is then transmitted, and generates a stop bit, all of which bits are caused to appear in serial fashion at the transmit data line T DAT of the ACIA 53 to be simultaneously applied to gates 54-1, 54-2 in the manner previously described. These levels enable one of the two frequencies (3 kHz and 1.5 kHz) to be passed to the output phone jack for transmission to the recording head of the cassette tape recorder to transfer all of the data from memory (in a non-destructive read out fashion) to the cassette tape. Data representing a 200 point harness takes less than 40 seconds to transfer to the magnetic tape cassette.

The recorder is first turned on, after which time the start push button 17 of the unit is depressed. Verification that an input signal is being applied to the tape recorder may be had by noting a $\frac{3}{4}$ to $\frac{7}{8}$ full scale deflection on the tape recorder meter. Data is arranged in a non-return to zero (NRZ) fashion when taken from the ACIA and is changed to FSK form by combination with the 1.5 kHz and the 3 kHz signals.

The pass light routine is entered when the transfer of data is completed to illuminate the pass LED 20 indicating that the transfer of data to the magnetic tape has been successfully completed.

As was also previously mentioned, the data may be transferred from a cassette tape into random access memory by application of the FSK data in serial form to FSK demodulator 60. The data is converted from FSK to binary NRZ form and applied in serial fashion to the input of asynchronous communications interface adapter 53 at a rate controlled by the read clock signal derived from the FSK signals. The ACIA 53 shifts the serial data into a register, performs a parity check and transmits the data in parallel fashion into random access memory 44. The time required for a record operation is the same as that required for transferring data from random access memory to a tape cassette.

The tape may also be utilized as a source for transmitting data to remote locations through a wireless or dedicated wire communications link, thereby providing a significant increase in system flexibility and capability which heretofore required shipment of an entire harness to a remote location in order to perform a test on harnesses at said remote location or in order to assemble harnesses to be reproduced at such remote location.

In order to perform a test routine, the mode selection switch 15 is set to the test position. Switch arm 15a vectors the MPU to select the first program step which then searches to determine which mode has been selected. In this case, since the test mode has been selected, the MPU will jump to the first program step of the test routine. The test routine operates the A and B scanners in much the same way as was previously described wherein the B scanner is stepped to the first contact position 48b-1, the A scanner is stepped to the second position 47b-2 and is incrementally stepped to each successive contact position, after which a strobe pulse is applied to continuity detector 52.

Of course, it should be understood that the connectors of the harness under test should be properly inserted into the connector sockets at 31–34 provided along the rear panel of the cable scanning unit preparatory to performance of the test mode. When a continuity condition is indicated by detector 52 (upon the occurrence of a strobe pulse), the contents of the address location corresponding to the present position of the B scanner is extracted from memory and compared with the binary word representing the present position of the A scanner. If these values compare indicating that continuity is correct, the test continues. If these values fail to compare, the subroutine for a short display is entered and an indication that an incorrect connection has been detected is displayed. In the event that a successful test has been completed, the MPU will jump to the pass display subroutine causing the "pass" LED 20 to be illuminated. In the event that an open condition is indicated, and this is compared with the data stored in memory which shows that a short circuit condition is called for for the point or points in interest, the MPU will cause a jump to the open display routine in which the "open" LED 21 will be illuminated, accompanied by display of two point numbers which will be displayed in sequential fashion to indicate a missing or poorly connected wire. In accordance with the open display routine, the lower numbered connection point will be displayed first, followed by the higher numbered connection point.

In the event that a short indication is called for, the short failure display routine will be called from read only memory by the MPU 40, causing the short LED 22 to be illuminated, accompanied by sequential display of two wire numbers indicating an incorrect connection between the two numbers displayed which should be open, wherein the lower of the two numbers will be displayed first, followed by the higher of the two numbers. The removal of the short circuit condition between these two points will not allow the test to continue, but a new test may be performed by shifting the mode selection switch 15 to the monitor position and then shifting the mode selector switch 15 back to the test position. A new test may also be initiated by allowing the mode selecting switch 15 to remain in the test position and by momentarily depressing the reset push button which will operate providing that the key switch is on, or providing that the W1 jumper has been wired into the circuit. However, it should be noted that, unless the error condition is a momentary one, the subsequent test mode will detect the same error again, be it a short or an open circuit condition.

The system described hereinabove may be wired to any harness through any type of interface connectors without the need for any programming change due to the versatile learning capability of the system. Unused points do not require termination, and multiple connection points do not require any special consideration and will all be simply and readily identified. However, as an aid in diagnosis of faults, it is recommended that multiple circuits be wired to successive point numbers for ease of comparison with a wire list.

The monitor mode is identical to the test mode but for the four following exceptions:

(1) Opens are not displayed; (2) when a short has been corrected, the monitor mode is continued; (3) following the testable points, another sequence is begun immediately; and (4) when a short occurs, a tone is sounded. Thus, when a harness is being assembled, obviously a number of open circuit conditions will be apparent for all those wires yet to be connected, hence the need for ignoring opens. The benefit of allowing the monitoring mode to continue when an erroneous short circuit has been detected and corrected reduces the overall assembly time by avoiding the need to reset the program back to the beginning of the monitor mode which would otherwise unnecessarily increase the assembly period for a harness.

The alarm need only be in the form of the audible alarm as the assembler is connecting a wire providing an immediate indication of the erroneous connection and allowing the operator to concentrate on the assembly without paying attention to the visual display by knowing that any detected error will be indicated by an audible alarm.

As was mentioned hereinabove, the LED display is implemented using a time division multiplex drive to the annodes and cathodes of the three numeric segmented display elements 24a-24c and the three discrete LED's 20-22. LED's 20-22 are treated as a single digit for scanning purposes. The HEX driver and latch circuitry scans the three segmented digits plus the three common connected LED's 20-22 in a cyclic fashion providing drive to their respective cathodes. In synchronization therewith, the decoder provides driver to the annodes. The discrete LED's 20-22 are treated in the same manner as segments and are shown connected to outputs a, b and e of decoder 58.

As was mentioned hereinabove, the vectoring of the MPU 40 to the reset position is accomplished by switch arm 15a ganged with switch arm 15a of the mode selection switch 15. Regardless of the mode selected, the flip-flop 71 is clocked true. Its output is inverted by inverter 72 to provide a reset pulse RST to serve as a start for MPU 40. Capacitor C7, resistor R30 and capacitor C8 establish the minimum and maximum reset pulse width.

As was mentioned hereinabove in connection with the momentary or prolonged power down condition, when the B+ rises, flip-flop 71 is clocked by operational amplifier 73 through diode CR2 creating a restart condition in MPU 40. Resistor R42 and capacitor C9 insure that MPU 40 will be restarted before the random access memory 44 is enabled to thereby protect the learned memory from any spurious levels.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

What is claimed is:

1. Apparatus for storing the circuit conditions existing between a plurality of end points established by the conductors of a known multiconductor harness, said apparatus comprising:

storage means for storing information representative of circuit conditions existing between said plurality of points established by the conductors of said known multiconductor harness;

testing means for applying a signal to said plurality of points;

detection means responsive to said signal for determining the existence of circuit conditions existing between said plurality of points;

transfer means responsive to said detection means for transferring information representative of said circuit conditions of the conductors of said known multiconductor harness to said storage means; and means responsive to data stored in said storage means for generating frequency shift keyed signals in serial fashion representative of the data in said storage means to facilitate transfer of said data to a storage device.

2. The apparatus of claim 1, wherein said storage means is comprised of random access memory means.

3. The apparatus of claim 2, further comprising microprocessor means for controlling the operation of said memory means, said testing means, said detection means, and said transfer means.

4. The apparatus of claim 3, further comprising second memory means for storing program data, said microprocessor means controlling said first-mentioned memory means, said testing means, said detection means, and said transfer means in accordance with the program data stored in said second memory means.

5. The apparatus of claim 4, wherein said second memory means comprises a read only memory means.

6. The apparatus of claim 4, wherein said second means comprises a programmable read only memory means.

7. The apparatus of claim 4, further comprising multiposition switch means; said microprocessor means being responsive to said switch means for operating in accordance with different program data in accordance with the switch setting of said multiposition switch means.

8. The apparatus of claim 1, wherein said testing means comprises scanner means.

9. The apparatus of claim 8, wherein said scanner means comprises first and second scanners.

10. The apparatus of claim 8, wherein said scanner means further comprises means for connecting to one end point of a harness and for scanning all other end points of said harness.

11. The apparatus of claim 9, wherein one of said scanners is connected to one of the end points of a harness coupled to said apparatus and wherein said second scanner sequentially scans the remaining end points of said harness.

12. The apparatus of claim 11, wherein said first scanner couples a signal to said one end point.

13. The apparatus of claim 11, wherein said second scanner sequentially couples said remaining end points to said detection means.

14. The apparatus of claim 9, wherein said first and second scanners are each comprised of a common input and a plurality of outputs;
each output of said second scanner being electrically coupled to an associated output of said first scanner.

15. The apparatus of claim 14, wherein the input of said first scanner is coupled to a signal source.

16. The apparatus of claim 14, wherein the common input of said first scanner is coupled to said detection means.

17. The apparatus of claim 8, wherein said scanner means comprises an analog switch means.

18. The apparatus of claim 17, wherein said analog switch means comprises a plurality of analog switches, each having a common input, a plurality of outputs, an inhibit line and output line selection control inputs, said inhibit line being responsive to a select signal for enabling the analog switch, said control inputs being responsive to binary control input signals for coupling one of said output lines to said common input.

19. The apparatus of claim 18, wherein all of said common inputs are connected in common to a buss.

20. The apparatus of claim 9, wherein said buss is coupled to said detection means.

21. The apparatus of claim 19, wherein a signal source is coupled to said buss.

22. The apparatus of claim 13, further comprising means for applying a strobe pulse to said detection means only when said second scanner is stepped to one of said remaining end points to initiate enablement of said detection means.

23. Apparatus for storing the circuit conditions existing between a plurality of end points established by the conductors of a known multiconductor harness and for comparing the circuit conditions existing between a plurality of points established by the conductors of a multiconductor harness to be tested to said circuit conditions of the conductors of said known multiconductor harness, said apparatus comprising:
storage means for storing information representative of circuit conditions existing between said plurality of points established by the conductors of said known multiconductor harness;
testing means for applying a signal to said plurality of points;
detection means responsive to said signal for determining the existence of circuit conditions existing between said plurality of points;
transfer means responsive to said detection means for transferring information representative of said circuit conditions of the conductors of said known multiconductor harness to said storage means;
comparing means for comparing the circuit conditions existing between said plurality of points established by the conductors of said known harness with the circuit conditions existing between the plurality of points established by the conductors of said harness to be tested;
control means for selectively operating said transfer means when the conductors of said known harness are connected to said points and for selectively operating said comparing means when the conductors of said multiconductor harness to be tested are connected between said points.

24. The apparatus of claim 23, wherein said comparing means further comprises means responsive to said detection means for comparing the end points being tested by said testing means with the interconnections in said storage means having the same end points.

25. The apparatus of claim 24, further comprising signaling means responsive to said comparing means for indicating the result of the comparing operation performed by the comparing means.

26. The apparatus of claim 23, wherein said testing means couples a test signal to one of said end points and sequentially couples said detection means to the remaining end points.

27. The apparatus of claim 26, further comprising means responsive to operation of said detection means for selecting a portion of said data in said storage means associated with the said one of said end points; said comparing means comparing the contents of said portion of said data with the end point being scanned by said testing means when said detection means was engaged.

28. The apparatus of claim 26, wherein said storage means comprises a plurality of storage locations, each being adapted to store data representing an end point.

29. The apparatus of claim 28, wherein the number of storage locations in said storage means is at least equal in number to the total number of end points capable of being scanned by said testing means.

30. The apparatus of claim 29, wherein each storage location is assigned an address, each said address representing an end point, and wherein the data stored in any location represents an end point in continuity with the end point associated with the address of the location in which the end point data is stored.

31. The apparatus of claim 29, wherein each storage location is assigned an address, each address being associated with an end point, and wherein open circuit conditions for any end point is characterized by said transfer means inserting a data word which is the same as the address of the location in which the data word is stored.

32. The apparatus of claim 1, further comprising plural contact means for connecting said apparatus to a harness; said testing means including first means responsive to a self test request for sequentially coupling a signal to each of said contact means; second means to sequentially couple each of said contact means to said detection means; identity determining means responsive to a continuity detecting signal for determining the identity of the contact means coupled to said first means and the contact means coupled to said detection means; means responsive to said identity determining means for indicating a successful self test when said first means and said second means are simultaneously connected to the same contact means.

33. The apparatus of claim 23, wherein said storage means comprises a plurality of storage locations for storing data representative of the interconnection states of a multi-conductor harness, including data representing open circuit conditions and short circuit conditions for the end points of the harness; means responsive to a monitor request for preventing said comparing means from comparing detected open circuit conditions during assembly of a harness.

34. The apparatus of claim 33, further comprising means responsive to said monitor request for continuously repeating a scanning operation when each previous scanning operation has been completed to determine spurious or momentary short circuit or open circuit conditions.

35. The apparatus of claim 26, wherein said testing means comprises scanner means; wherein said scanner means comprises first and second scanners; and wherein said scanner means further comprises means for connecting to one end point of a harness and for scanning all other end points of said harness.

* * * * *

UNITED STATES PATENT AND TRADEMARK OFFICE
CERTIFICATE OF CORRECTION

PATENT NO. : 4,257,002
DATED : March 17, 1981
INVENTOR(S) : William E. Helms and Jack W. Adams It is certified that error appears in the above-identified patent and that said Letters Patent are hereby corrected as shown below:

Column 8, line 37, "An" should be -- As --.

Column 11, line 45, "54-5" should be -- 54-4 --.

Column 20, line 16, "15a" (first occurrence) should be -- 15c --.

Column 21, line 56 (Claim 20, line 1), "9" should be -- 19 --.

Signed and Sealed this

Twenty-third Day of February 1982

[SEAL]

Attest:

GERALD J. MOSSINGHOFF

Attesting Officer

Commissioner of Patents and Trademarks